(12) United States Patent
Drabe et al.

(10) Patent No.: US 12,071,338 B2
(45) Date of Patent: Aug. 27, 2024

(54) MICROMECHANICAL STRUCTURE AND METHOD OF PROVIDING THE SAME

(71) Applicant: Fraunhofer-Gesellschaft zur Foerderung der angewandten Forschung e.V., Munich (DE)

(72) Inventors: Christian Drabe, Dresden (DE); Bert Kaiser, Dresden (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 538 days.

(21) Appl. No.: 17/459,073

(22) Filed: Aug. 27, 2021

(65) Prior Publication Data

US 2021/0387851 A1  Dec. 16, 2021

Related U.S. Application Data

(63) Continuation of application No. PCT/EP2020/055000, filed on Feb. 26, 2020.

(30) Foreign Application Priority Data

Feb. 27, 2019  (DE) .................... 10 2019 202 656.7
Feb. 27, 2019  (DE) ..................... 102019202658.3

(51) Int. Cl.
*G02B 26/08* (2006.01)
*B81B 3/00* (2006.01)

(52) U.S. Cl.
CPC ........ *B81B 3/0051* (2013.01); *G02B 26/0833* (2013.01); *G02B 26/0841* (2013.01);
(Continued)

(58) Field of Classification Search
CPC ............ B81B 3/0051; B81B 2201/033; B81B 2201/035; B81B 2201/037;
(Continued)

(56) References Cited

U.S. PATENT DOCUMENTS 7,466,474 B2   12/2008 Jung et al.
7,508,111 B2   3/2009 Ko et al.
(Continued)

FOREIGN PATENT DOCUMENTS

DE       10235370 A1   2/2004
DE    102009045720 A1   4/2011
(Continued)

OTHER PUBLICATIONS

"Drafed Zwischenbericht", Raunhofer-Institut Für Photonische Mikrosysteme IPMSrev2, 170731, reference available in German only, Sep. 25, 2017, 13 pp.
(Continued)

*Primary Examiner* — Euncha P Cherry
(74) *Attorney, Agent, or Firm* — Perkins Coie LLP; Michael A. Glenn

(57) ABSTRACT

A micromechanical structure has a first micromechanical element, a second micromechanical element and a torsion spring arrangement having a first torsion spring element, having a first center line, mechanically connected to the first micromechanical element at a first contact region and to the second micromechanical element at a second contact region, and having a second torsion spring element, having a second center line, mechanically connected to the first micromechanical member at a third contact region and to the second micromechanical member at a fourth contact region in order to connect the first micromechanical member and the second micromechanical member to be movable relative to each other. A distance between the first and second center lines, starting from the first and third contact regions toward the second and fourth contact regions, decreases in a first portion and increases in a second portion. In a rest position of the micromechanical structure, the first and second tor-
(Continued)

sion spring elements are arranged without contact to each other.

22 Claims, 11 Drawing Sheets

(52) U.S. Cl.
CPC ... *B81B 2201/033* (2013.01); *B81B 2201/035* (2013.01); *B81B 2201/037* (2013.01); *B81B 2201/042* (2013.01); *B81B 2203/0154* (2013.01); *B81B 2203/04* (2013.01); *B81B 2203/051* (2013.01); *B81B 2203/053* (2013.01); *B81B 2203/058* (2013.01)

(58) Field of Classification Search
CPC ...... B81B 2201/042; B81B 2203/0154; B81B 2203/04; B81B 2203/051; B81B 2203/053; B81B 2203/058; G02B 26/0833; G02B 26/0841; G02B 26/0808
See application file for complete search history.

(56) References Cited

U.S. PATENT DOCUMENTS

| | | | |
|---|---|---|---|
| 7,535,620 | B2 | 5/2009 | Zhou |
| 7,538,471 | B2 | 5/2009 | Kurozuka et al. |
| 9,306,475 | B1 | 4/2016 | Ba-tis et al. |
| 9,733,470 | B2 * | 8/2017 | Gu-Stoppel ........ G02B 26/0833 |
| 2003/0053186 | A1 | 3/2003 | Arima |
| 2003/0057350 | A1 | 3/2003 | Miller et al. |
| 2003/0174931 | A1 | 9/2003 | Rodgers et al. |
| 2005/0046504 | A1 | 3/2005 | Xiaoyu et al. |
| 2005/0174624 | A1 | 8/2005 | Greywall |
| 2006/0107743 | A1 | 5/2006 | Ullmann |
| 2006/0125347 | A1 | 6/2006 | Yoda et al. |
| 2006/0220492 | A1 | 10/2006 | Greywall |
| 2008/0073163 | A1 | 3/2008 | Weir et al. |
| 2008/0074718 | A1 | 3/2008 | Bush et al. |
| 2008/0151345 | A1 | 6/2008 | Zhou |
| 2009/0201095 | A1 | 8/2009 | Onuma |
| 2011/0090551 | A1 | 4/2011 | Pirk et al. |
| 2011/0205609 | A1 | 8/2011 | Mizoguchi |
| 2012/0119614 | A1 | 5/2012 | Gutierrez |
| 2014/0300942 | A1 | 10/2014 | Wilhelmus et al. |
| 2014/0340726 | A1 | 11/2014 | Gu-Stoppel et al. |
| 2015/0203346 | A1 | 7/2015 | Fujimoto et al. |
| 2018/0017783 | A1 | 1/2018 | Ji et al. |

FOREIGN PATENT DOCUMENTS

| | | |
|---|---|---|
| DE | 102008012825 B4 | 8/2011 |
| DE | 102013209234 A1 | 11/2014 |
| EP | 1123526 B1 | 7/2002 |
| JP | 2006167860 A | 6/2006 |
| JP | 4285005 B2 | 4/2009 |
| JP | 2015229220 A | 12/2015 |
| WO | 0025170 A1 | 5/2000 |
| WO | 0196930 A1 | 12/2001 |

OTHER PUBLICATIONS

"Microscanner Using Self Aligned Vertical Comb Drives in a Switched Electrode Configuration for Large Static Rotation", IEEE 2009, 2009, 2 pp.

Cagdaser, Baris, et al., "Capacitive sense feedback control for MEMS beam steering mirrors", Proc. 2004 Solid-State Sensor and Actuator Workshop, pp. 348-351, Jun. 2004, pp. 348-351.

Milanović, Veljko, et al., "Laterally Actuated Torsional Micromirrors for Large Static Deflection", IEEE Photonics Technology Letters, vol. 15, No. 2, pp. 245-247, Feb. 2003, pp. 245-247.

Zhou, Lixia, et al., "Scanning micromirrors fabricated by an SOI-SOI Wafer-Bonding Process", Journal of Microelectromechanical Systems, vol. 15, No. 1, pp. 24-32, Feb. 2006, pp. 24-32.

* cited by examiner

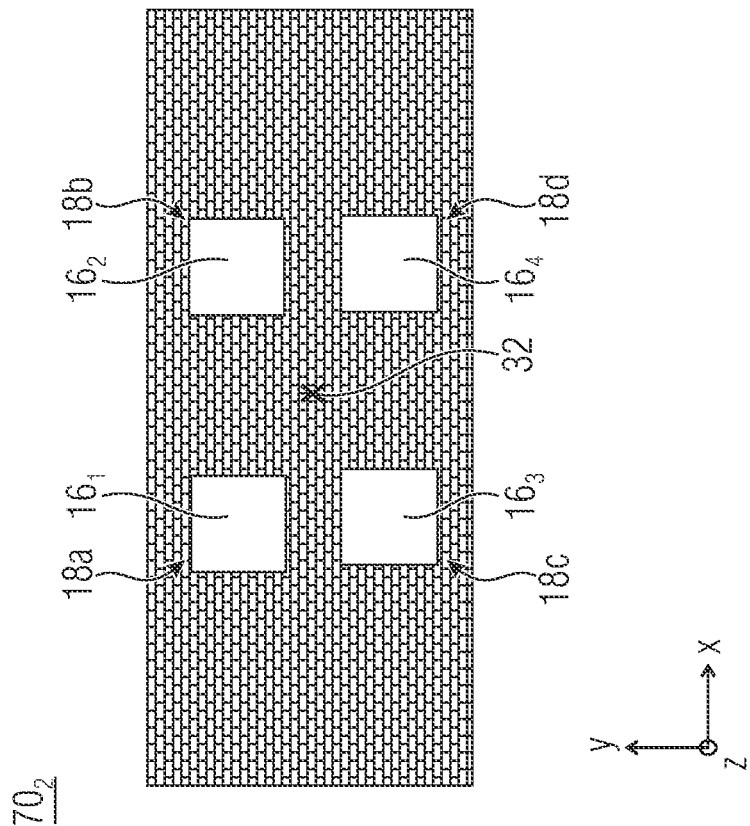
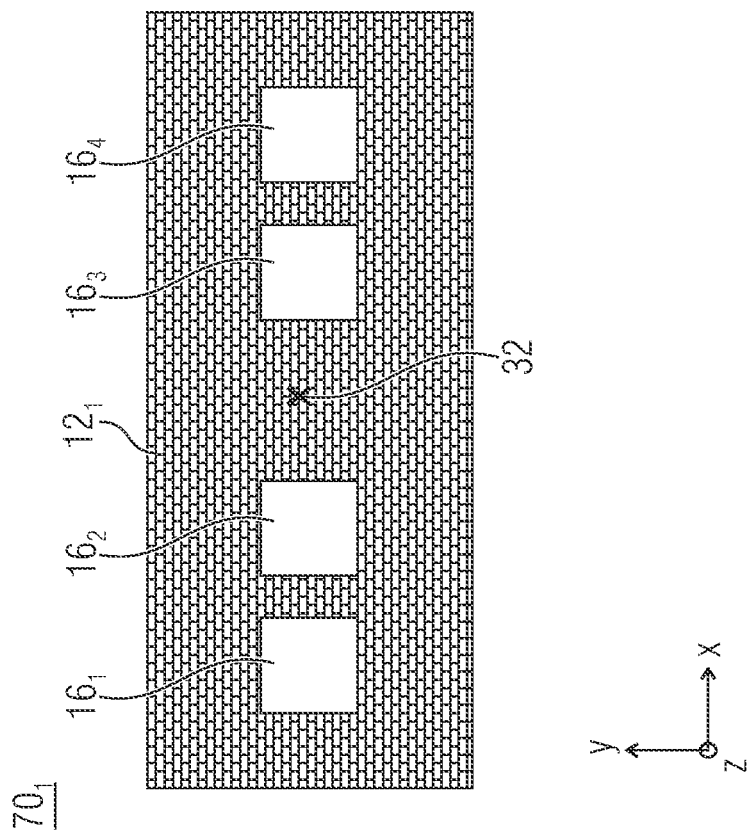
Fig. 7a
Fig. 7b

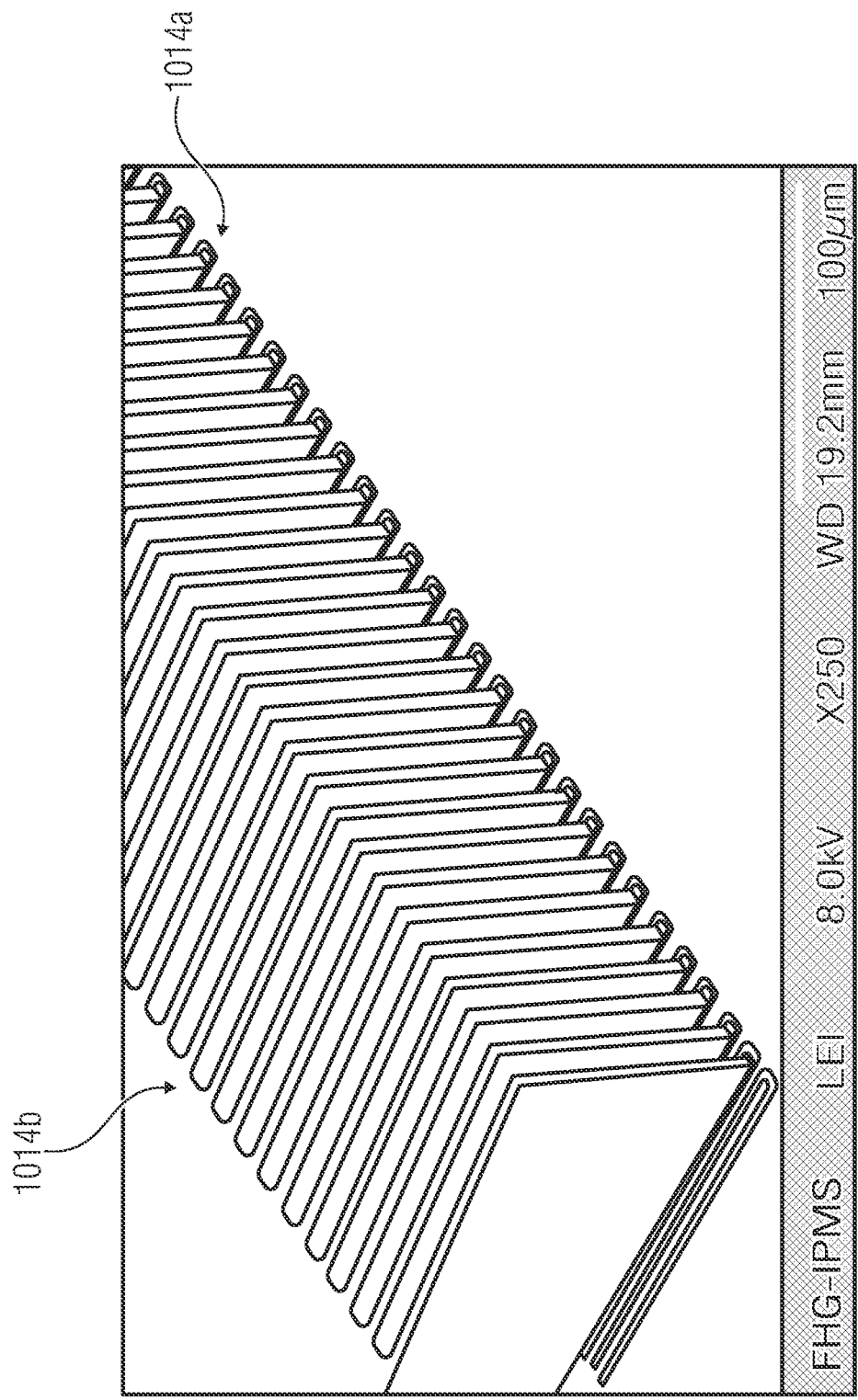

MICROMECHANICAL STRUCTURE AND METHOD OF PROVIDING THE SAME

CROSS-REFERENCE TO RELATED APPLICATIONS

This application is a continuation of copending International Application No. PCT/EP2020/055000, filed Feb. 26, 2020, which is incorporated herein by reference in its entirety, and additionally claims priority from German Application No. 102019202658.3, filed Feb. 27, 2019, and from German Application No. 102019202656.7, filed Feb. 27, 2019, both of which are also incorporated herein by reference in their entirety.

BACKGROUND OF THE INVENTION

The present invention relates to a micromechanical structure, and more particularly to a micromechanical structure comprising a movable element deflectable by a deflection of a torsion spring. The present invention further relates to a method of providing such a micromechanical structure. The present invention further relates to push-resistant torsion springs.

To move micro-electro-mechanical systems (MEMS), such as micromirrors or microgratings, out of their plane (out-of-plane), electrostatic methods are available in addition to various physical methods, such as magnetic, piezo-electric and acoustic.

A known system 1000 is shown in a schematic top view in FIG. 8a. Torsion springs 1006 are arranged between a frame 1002 and a micromirror 1004. FIG. 8b shows a schematic lateral sectional view in a sectional plane A-A' of the device 1000, in which the rectangular profile of the torsion springs 1006 at the abutments, i.e. at the substrate 1002, can be seen. The torsion springs 1006 allow for a torsional movement 1008 of the used element 1004 out of a reference plane 1012, shown in FIG. 8c. The circular representation of the spring profiles or cross-sections in FIG. 8c indicates that the torsion springs are deflected, i.e. twisted, although when viewed locally, a polygonal cross-section of the torsion springs may remain substantially polygonal.

In the case of a drive system positioned laterally in the reference plane 1012, such as pairs 1014$_1$ and 1014$_2$ of electrodes 1014a and 1014b, application of an electrical voltage between the electrodes 1014a and 1014b generates forces that can cause movements in different degrees of freedom. In addition to the restoring force desired in the deflected case shown, see FIG. 8c, which generates a torsional moment acting about a rotation axis 1016 to excite resonant oscillation, as described, for example, in EP 1 123 526 B1, the element 1004 to be deflected can also be deflected by parasitic forces, i.e. forces not desired for the actual movement, in the direction of accordingly parasitic degrees of freedom, as is indicated, for example, by the movement arrows 1018$_1$ and 1018$_2$. Here, the movement arrow 1018$_1$ indicates, for example, a rotation of the micromirror 1004 in an x/z plane perpendicular to the desired torsional movement 1008 about a z axis or an axis parallel thereto. The movement arrow 1018$_2$ indicates a lateral displacement along a positive and/or negative x direction, wherein in principle any parasitic movements may occur.

Due to the parasitic movements, for example, the laterally arranged electrode combs in the pairs 1014$_1$ and 1014$_2$ cause a rotation or translation in the x/z plane, i.e. in-plane. Accordingly, a so-called pull-in voltage, in which the element 1004 to be deflected in latched in, limits the actually desired deflection, since the electrical potential that can be applied is limited. This results in a limitation of the couple-able/usable energy of the actual useful mode.

FIG. 9 shows an exemplary scanning electron microscope (SEM) perspective image of interdigital electrodes 1014a and 1014b in an out-of-plane deflected state, where an attractive force can be generated between interdigital electrodes 1014a and 1014b by applying an electric voltage. When the electrodes (combs) are in the same plane in the rest state (zero position), applying a suitable square-wave voltage near twice the resonant frequency can cause the devices to resonate, as shown in FIG. 10. Here, the electrode combs engage into one another in the rest position. In other words, FIG. 10 shows a schematic diagram for resonant operation of micromechanical devices. A square-wave voltage of twice the frequency of the resonant frequency generates the drive, the accelerated voltage is switched on at the upper and lower reversal points of the oscillation, and switched off in the rest position.

Alternative spring shapes are shown in literature to counteract lateral movement of an element, such as a V-shaped torsion spring arrangement 1022$_1$ and 1022$_2$ of a known microelectro-mechanical system 2000, shown schematically in FIG. 11.

However, these entail the problem that, although this increases the resistance of a classical torsion spring to translational and rotational forces in the plane, this also results in an increase in the effective torsional stiffness, which is undesirable.

It would be desirable to have torsion spring arrangements which provide both high resistance to translational in-plane forces and rotational forces, while resulting in a small or even negligible increase in torsional stiffness.

Therefore, an object underlying the present invention is to provide torsion spring arrangements which provide high resistance to undesirable or parasitic in-plane movements, while resulting in a small or negligible increase in torsional stiffness relative to a single torsion spring.

SUMMARY

According to an embodiment, a micromechanical structure may have: a first micromechanical element; a second micromechanical element; and a torsion spring arrangement comprising a first torsion spring element, comprising a first center line, mechanically connected to the first micromechanical element at a first contact region and to the second micromechanical element at a second contact region, and comprising a second torsion spring element, comprising a second center line, mechanically connected to the first micromechanical element at a third contact region and to the second micromechanical element at a fourth contact region in order to connect the first micromechanical element and the second micromechanical element to be movable relative to each other; wherein a distance between the first center line and the second center line, starting from the first and third contact regions towards the second and fourth contact regions, decreases in a first portion and increases in a second portion; wherein, in a rest position of the micromechanical structure, the first torsion spring element and the second torsion spring element are arranged without contact to each other; wherein the first center line comprises a first center and the second center line comprises a second center; wherein the first center line, on a first side starting from the first center, extends in a quarter ellipse path towards the first contact region and, on a second side opposite the first side, in a quarter ellipse path towards the second contact region;

and wherein the second center line, on a first side starting from the second center, extends in a quarter ellipse path towards the third contact region and, on a second side opposite the first side, in a quarter ellipse path towards the fourth contact region; wherein the center lines of the torsion spring elements extend along axial extension directions of the torsion spring elements, wherein the extension directions are variable in a plane of the micromechanical structure, wherein a cross-section of the first torsion spring element and of the second torsion spring element increases linearly or non-linearly perpendicularly to the axial extension direction and starting from the center line centers of the center line; or decreases linearly or non-linearly.

According to another embodiment, a micromechanical structure may have: a first micromechanical element; a second micromechanical element; a torsion spring arrangement comprising a first torsion spring element, comprising a first center line, mechanically connected to the first micromechanical element at a first contact region and to the second micromechanical element at a second contact region, and comprising a second torsion spring element, comprising a second center line, mechanically connected to the first micromechanical element at a third contact region and to the second micromechanical element at a fourth contact region in order to connect the first micromechanical element and the second micromechanical element to be movable relative to each other; wherein a distance between the first center line and the second center line, starting from the first and third contact regions towards the second and fourth contact regions, decreases in a first portion and increases in a second portion; wherein, in a rest position of the micromechanical structure, the first torsion spring element and the second torsion spring element are arranged without contact to each other; wherein the distance between the center lines comprises a minimum in a region of center line centers and increases starting from the center line centers towards the first micromechanical element and towards the second micromechanical element; and the torsion spring elements are formed to be straight in sections and are arranged in accordance with an X shape, wherein the torsion spring elements are arranged without contact to each other.

According to another embodiment, a method of providing a micromechanical structure may have the steps of: providing a first micromechanical element; providing a second micromechanical element; arranging a torsion spring arrangement comprising a first torsion spring element, comprising a first center line, so that it is mechanically connected to the first micromechanical element at a first contact region and to the second micromechanical element at a second contact region, and comprising a second torsion spring element, comprising a second center line, so that it is mechanically connected to the first micromechanical element at a third contact region and to the second micromechanical element at a fourth contact region in order to connect the first micromechanical element and the second micromechanical element to be movable relative to each other; such that a distance between the first center line and the second center line, starting from the first and third contact regions towards the second and fourth contact regions, decreases in a first portion and increases in a second portion; and such that, in a rest position of the micromechanical structure, the first torsion spring element and the second torsion spring element are arranged without contact to each other; such that the first center line comprises a first center and the second center line comprises a second center; such that the first center line, on a first side starting from the first center, extends in a quarter ellipse path towards the first contact region and, on a second side opposite the first side, in a quarter ellipse path towards the second contact region; and such that the second center line, on a first side starting from the second center, extends in a quarter ellipse path towards the third contact region and, on a second side opposite the first side, in a quarter ellipse path towards the fourth contact region; such that the center lines of the torsion spring elements extend along axial extension directions of the torsion spring elements, such that the extension directions are variable in a plane of the micromechanical structure, such that a cross-section of the first torsion spring element and of the second torsion spring element increases linearly or non-linearly perpendicularly to the axial extension direction and starting from the center line centers of the center line; or decreases linearly or non-linearly.

According to still another embodiment, a method of providing a micromechanical structure may have the steps of: providing a first micromechanical element; providing a second micromechanical element; arranging a torsion spring arrangement comprising a first torsion spring element, comprising a first center line, so that it is mechanically connected to the first micromechanical element at a first contact region and to the second micromechanical element at a second contact region, and comprising a second torsion spring element, comprising a second center line, so that it is mechanically connected to the first micromechanical element at a third contact region and to the second micromechanical element at a fourth contact region in order to connect the first micromechanical element and the second micromechanical element to be movable relative to each other; such that a distance between the first center line and the second center line, starting from the first and third contact regions towards the second and fourth contact regions, decreases in a first portion and increases in a second portion; and such that, in a rest position of the micromechanical structure, the first torsion spring element and the second torsion spring element are arranged without contact to each other; such that the distance between the center lines comprises a minimum in a region of center line centers and increases starting from the center line centers towards the first micromechanical element and towards the second micromechanical element; and the torsion spring elements are formed to be straight in sections and are arranged in accordance with an X shape such that the torsion spring elements are arranged without contact to each other.

A core idea of the present invention is having recognized that by only partially bringing the torsion springs closer together, the achieved effect can be obtained, that is obtaining a torsion spring of increased resistance to lateral forces while maintaining or merely negligibly increasing the stiffness of the torsion spring.

According to an embodiment, a micromechanical structure comprises a first micromechanical element and a second micromechanical element. The micromechanical structure comprises a torsion spring arrangement comprising a first torsion spring element connected to the first micromechanical element at a first contact region and connected to the second micromechanical element at a second contact region. The torsion spring arrangement further comprises a second torsion spring element mechanically connected to the first micromechanical element at a third contact region and to the second micromechanical element at a fourth contact region. The torsion spring arrangement allows relative movement of the first micromechanical element with respect to the second micromechanical element. The torsion spring elements each have a center line, such as a geometric center line or a line obtained by connecting centroids of cross-sections of the torsion spring elements along an axial extension direction thereof. Starting from the first and third contact regions towards the second and fourth contact regions, a distance between the center lines decreases in a first portion and increases in a second portion. This allows increasing the lateral stiffness of the torsion springs by a factor of at least 2 to 3 with at least approximately comparable torsional stiffness when the torsion spring arrangement is formed with the arrangement of a single torsion spring according to FIG. 8a to FIG. 8c.

According to an embodiment, a method of providing a micromechanical structure comprises providing a first micromechanical element and providing a second micromechanical element, and arranging a torsion spring arrangement comprising a first torsion spring element, having a first center line, such that the first torsion spring element is mechanically connected to the first micromechanical element at a first contact region and to the second micromechanical element at a second contact region. Furthermore, a second torsion spring element, having a second center line, is arranged such that it is mechanically connected to the first micromechanical element at a third contact region and to the second micromechanical element at a fourth contact region in order to connect the first micromechanical element and the second micromechanical element to be movable relative to each other. Here, a tempo rally sequential arrangement of the torsion spring elements may be performed, but it is also possible to form the first micromechanical element and/or the second micromechanical element and/or the torsion spring arrangement entirely or partially from one material, for ex ample simultaneously or at least within one process step, for example by selectively etching a semiconductor material. The method is carried out such that, starting from the first and third contact regions towards the second and fourth contact regions, a distance between the first center line and the second center line decreases in a first portion, and increases in a second portion. In a rest position of the micromechanical structure, the first torsion spring element and the second torsion spring element are arranged without contact to each other.

BRIEF DESCRIPTION OF THE DRAWINGS

Embodiments of the present invention will be explained below referring to the appended drawings, in which:

FIGS. 7a-b show schematic lateral sectional views of inventive MEMS with a number of spring elements greater than 2;

FIG. 9 shows an exemplary perspective SEM image of interdigital electrodes in which an attractive force can be generated between interdigital electrodes by applying an electric voltage;

DETAILED DESCRIPTION OF THE INVENTION

Figure 1:
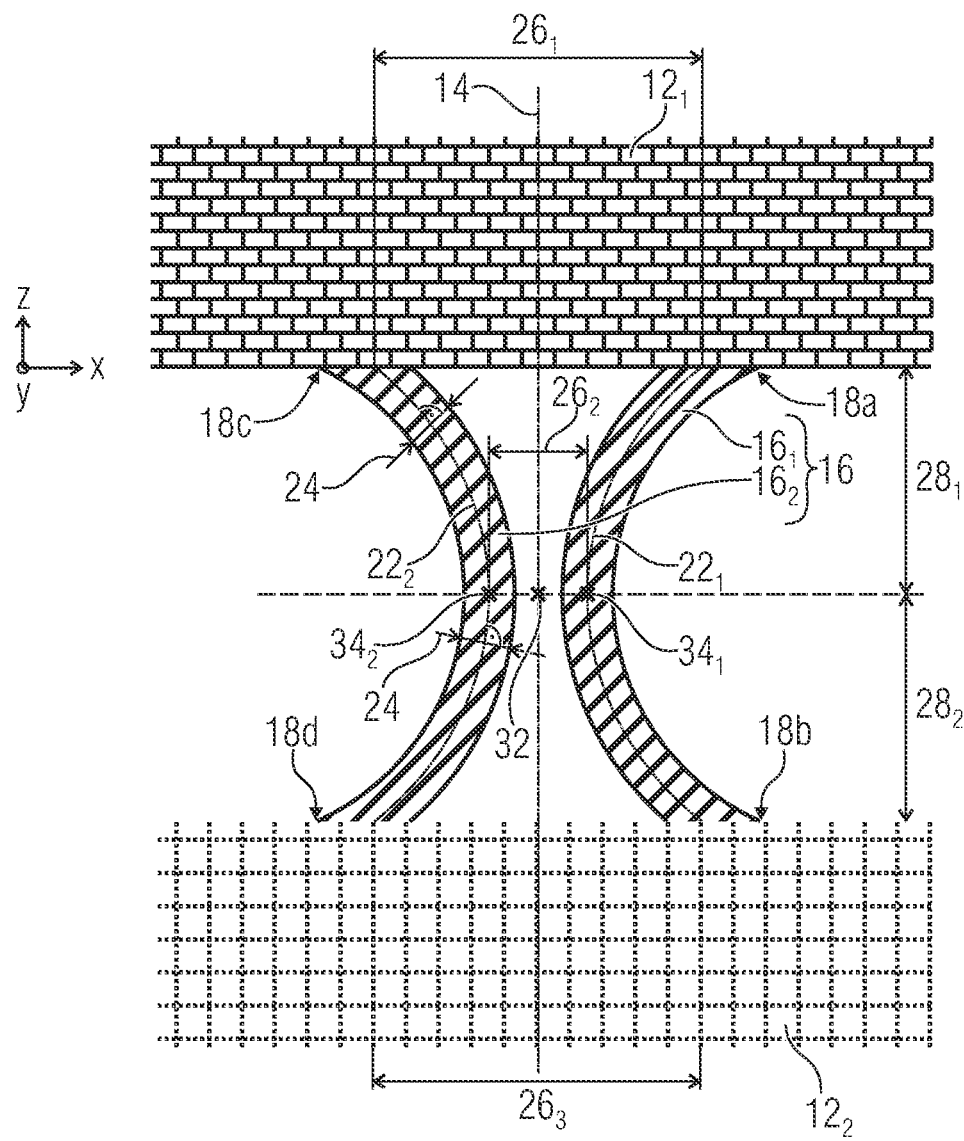
FIG. 1 shows a schematic top view of an MMS according to an embodiment in which torsion spring elements have a curved shape.

Before embodiments of the present invention will be explained in detail below referring to the drawings, it is pointed out that identical elements, objects and/or structures or those of equal function or equal effect are provided with the same reference signs in the different figures, so that the description of these elements shown in different embodiments is interchangeable or mutually applicable.

The following embodiments relate to micromechanical structures (MMS), wherein micromechanical elements can be deflected relative to one another for this purpose, for example using an actuator. The actuator can be formed electrically or non-electrically, for example as a thermal actuator. If the actuator is formed as an electrical actuator, for example as an electrostatic actuator, piezoelectric actuator, pneumatic actuator, and/or hydraulic actuator, the MMS may also be referred to as a micro-electro-mechanical system (MEMS). Therefore, the terms MMS and MEMS used herein are combinable or interchangeable as desired and are used interchangeably unless specific differences are addressed.

MEMS and/or MMS as depicted in embodiments described herein may be fabricated, for example, as part of a semiconductor manufacturing process, such as a complementary metal oxide semiconductor (CMOS) process. This may involve forming structures from a layered structure or a layer stack structure, as well as using bulk micro-machining, e.g. from single-crystalline substrates, for example by etching processes. Suitable materials for the MEMS described herein may include, for example, silicon materials, such as silicon, silicon oxide, silicon nitride, and/or silicon oxynitride, but may also include other materials, like metals such as copper, aluminum, or the like. Further or different semiconductor materials may also be used, such as gallium arsenide.

FIG. 1 shows a schematic top view of an MMS 10 according to an embodiment. The MMS 10 comprises a first micromechanical element $12_1$ and a second micromechanical element $12_2$. The micromechanical elements $12_1$ and $12_2$ may be arranged in the MMS 10 to be movable relative to each other, in particular about a torsion axis 14, which may correspond to the torsion axis 1016, for example, and may be arranged in the x/z plane. The micromechanical elements $12_1$ and $12_2$ may be, comprising a pairing, an element to be regarded as rigid, for example a substrate, and an element arranged movable relative thereto, for example an optical element, such as a micromirror, a micrograting or the like, but two elements each arranged to be movable with respect to a further substrate may also be implemented. In this case, a substrate can provide a frame structure or any other reference structure with respect to which another element is movable. Formed as a frame, the substrate may be arranged at or on a further substrate. For example, at least one of the elements $12_1$ and $12_2$ may be part of a lever transmission or gear transmission. Furthermore, it should be noted that the arrangement of drives and torsional movements described herein is not limited to optical applications, but rather can be used in all fields of micromechanical structures such that at least one of the micromechanical elements $12_1$ and $12_2$ may also be part of an electrical switch, a valve, or the like.

The MMS 10 comprises a torsion spring arrangement 16 having a first torsion spring element $16_1$ and a second torsion spring element $16_2$. At a contact region 18a, the torsion spring element $16_1$ is mechanically connected to the micromechanical element $12_1$, for example by a fixation and/or by an integral connection or material transition, such as during an etching process or the like. At a contact region 18b, the torsion spring element $16_1$ is mechanically connected to the micromechanical element $12_2$. At a contact region 18c, the torsion spring element $16_2$ is mechanically fixedly connected to the micromechanical element $12_1$, and at a contact region 18d, to the micromechanical element $12_2$, so that the relative movement of the micromechanical elements $12_1$ and $12_2$ relative to each other about the torsion axis 14 is effected by a simultaneous deformation of the torsion spring elements $16_1$ and $16_2$ of the torsion spring arrangement 16.

FIG. 1 shows an embodiment in which the torsion spring elements $16_1$ and $16_2$ have a curved shape, that is an axial extension direction of the torsion spring elements $16_1$ and $16_2$ in the x/z plane from the micromechanical element $12_1$ towards the micromechanical element $12_2$ and vice versa is variable in the x/z plane, wherein this variation can be continuous, such as in the form of a round or elliptical arc, but can also be discontinuous, such as straight in sections with different directions. Embodiments provide for combinations of continuous and discontinuous portions.

The torsion spring element $16_1$ has a center line $22_1$, while the torsion spring element $16_2$ has a center line $22_2$. The center lines $22_1$ and $22_2$ may be understood to be that line, possibly virtual, which can be obtained by connecting those points obtained when a dimension 24 is bisected perpendicularly to a local axial extension direction. In this context, the dimension 24 can be given in the x/z plane and may be understood to be, exemplarily but not exclusively, a spring width, while a dimension of the torsion spring elements $16_1$ and $16_2$ along a y direction perpendicular thereto may be understood to be a spring thickness. In this respect, the center line $22_1$ and $22_2$ can be arranged in the area of the half dimension along the y direction. Due to the curved design of the axial extension of the torsion spring elements $16_1$ and $16_2$, the center line $22_1$ and $22_2$ may also be curved. This means that the center lines 22 can extend along axial extension directions of the torsion spring elements $16_1$ and $16_2$.

The contact regions 18a and 18b and 18c and 18d may each be arranged opposite to each other. A distance 26 between the center lines $22_1$ and $22_2$ can be variable along the axial course of the torsion spring elements $16_1$ and $16_2$ and in a course from the contact regions 18a and 18c towards the contact regions 18b and 18d or vice versa. Starting from the contact regions 18a and 18c towards the contact regions 18b and 18d, the distance 26 can in particular be decreasing from an initial distance $26_1$ in a first region $28_1$. The distance 26 may decrease until it reaches a local or global minimum in a distance value $26_2$. The distance of the center lines $26_2$ may be of any value, limited towards small values by the fact that the torsion spring elements $16_1$ and $16_2$ do not contact or overlap (merge) between the regions $28_1$ and $28_2$. In a region $28_2$ adjacent to the region $28_1$, the distance 26 may increase again so that a distance between the center lines $22_1$ and $22_2$ in the region of the contact regions 18b and 18d has increased again to the distance $26_3$. Advantageously, and to maintain a geometry, the distance $26_3$ is the same as the distance $26_1$. Exemplary values for MEMS spring widths may vary from at least 100 nm to a maximum of 200 µm. Advantageously, values in the range of at least 2 µm and at most 120 µm are implemented. The distances, in particular the distance $26_2$, can have a value of at least 1.5 µm and at most 5 mm, for example, advantageously at least 5 µm and at most 1 mm.

The varying distance 26 may be implemented such that the torsion springs $16_1$ and $16_2$ do not contact each other both in the rest position and during operational or designed deflection in order to avoid influencing or restricting movements or damage caused by mechanical contact. In other words, the two torsion springs $16_1$ and $16_2$ are located at a distance from each other that allows unobstructed mechanical deflectability, that is without collision of the two spring elements in the rotationally deflected state, of the two elements $12_1$ and $12_2$ relative to each other and, as parameter, allows optimization for deflection under the set or used forces. This means that through further simulations and parameters varied therein such as spring widths, spring spacings and angles, as well as changes in cross-section, there is further potential for optimization with regard to the target parameters and mechanical stress values, for example.

Although the MMS 10 is shown and described such that, starting from the contact regions 18a and 18c, the distance 26 decreases in the region $28_1$ and increases in the region $28_2$, it is also possible for this order to be reversed and for an increase in distance to occur first in the portion $28_1$ and a decrease to occur in the portion $28_2$, although the described embodiment is of advantage. This can be obtained, for example, by interchanging the positions of the torsion spring elements $16_1$ and $16_2$ or by rotating each of the spring elements $16_1$ and $16_2$ by 180 degrees in the z/x plane, such as by rotating them about the z axis or by mirroring them on the z/y plane. This means that the MMS 10 may be formed such that the torsion spring elements $16_1$ and $16_2$ form arcuate openings facing away from each other. Alternatively, in addition to other configurations, it is also possible for the torsion spring elements $16_1$ and $16_2$ to form mutually facing arcuate openings.

In the region of low or minimal distances 26, a torsional stiffness of the torsion spring arrangement 16 is comparatively lower than in regions of higher distance. At the same time, the high distances allow for resistance to the parasitic movements, with the resistance increasing with greater a distance. Thus, by varying the distance using portions $28_1$ and $28_2$, the high resistance to parasitic movements can be obtained while accepting a small or negligible increase in torsional stiffness, thereby obtaining a high overall efficiency of the MMS 10.

According to an embodiment, the torsion spring elements $16_1$ and $16_2$ are arranged to be point-symmetrical around a common symmetry point 32. The point of symmetry 32 may be arranged such that the portions $28_1$ and $28_2$ have an equal lateral extension along the z direction, for example. Furthermore, the point of symmetry 32 may be arranged in the z/x plane such that it is located at a transition between the portions $28_1$ and $28_2$ centrally between the respective positions of the center lines $22_1$ and $22_2$. The point-symmetrical design of the torsion spring elements $16_1$ and $16_2$ can refer to at least one of the geometrical arrangement of the contact regions 18a to 18d, the dimension 24 of the respective torsion spring element $16_1$ and $16_2$ as well as the respective complementary spring thickness along the y direction, a course of the center lines $22_1$ and $22_2$ in the different torsion spring elements $16_1$ and $16_2$ and in the portions $28_1$ and $28_2$ as well as a design of the regions $28_1$ and $28_2$. Advantageously, several of these points are implemented, and in particular it is of advantage to set point symmetry with respect to all of these parameters. In particular, it is of advantage to arrange the point of symmetry 32 on the torsion axis 14.

According to embodiments, the pairs of contact regions 18a and 18b and 18c and 18d and/or the course of the center line are defined by two points or the course of a nonlinear function, such as a root function, a parabola or the like, or a regular geometric body. According to embodiments, this also relates to center points $34_1$ and $34_2$ of center lines $22_1$ and $22_2$, respectively. In other words, examples of such regular or irregular geometries may include the following:
1. The ellipse may be a circle;
2. in the ellipse, the long or short semi-axis may be parallel to the torsion axis;
3. instead of the ellipse, the center line of the quarter springs may be described by a root function, a squared function or another polynomial;
4. the cross-section of the quarter torsion spring may increase or decrease linearly towards the outside;
5. the cross-section of the quarter torsion spring may increase or decrease nonlinearly towards the outside;
6. points 1 to 5 may be combined with each other.

Figure 3:
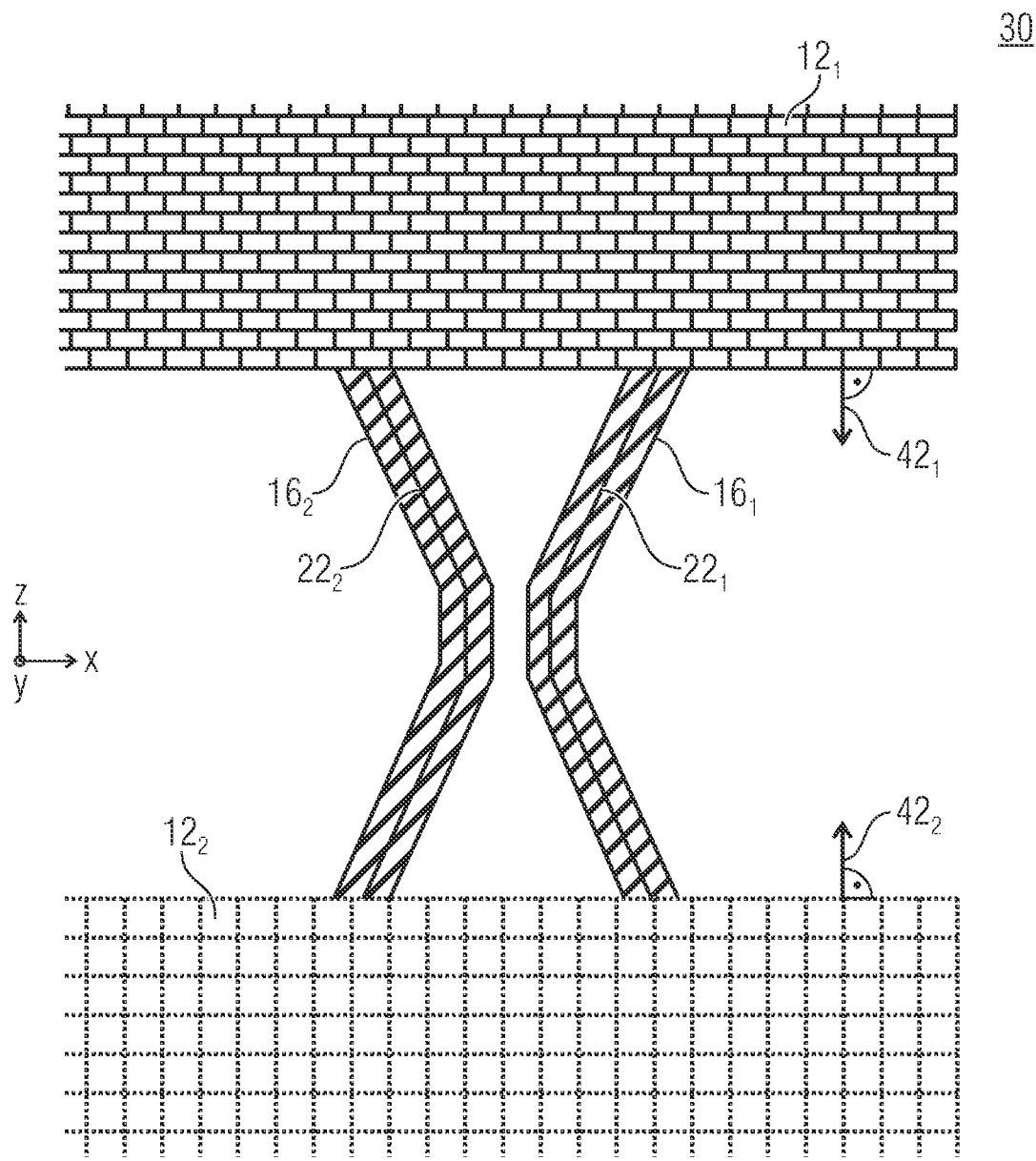
FIG. 3 shows a schematic top view of an MMS according to an embodiment in which the torsion spring arrangement is formed such that the torsion spring elements are formed to be straight in sections.

According to embodiments, the center line of the quarter torsion spring can have a linear outwardly opening course, as shown, for example, in FIG. 3. Further variations are, for example, for the cross-section of the quarter torsion spring to increase or decrease linearly towards the outside (FIG. 5) or to increase or decrease non-linearly, see, for example, FIG. 4.

Figure 8A:
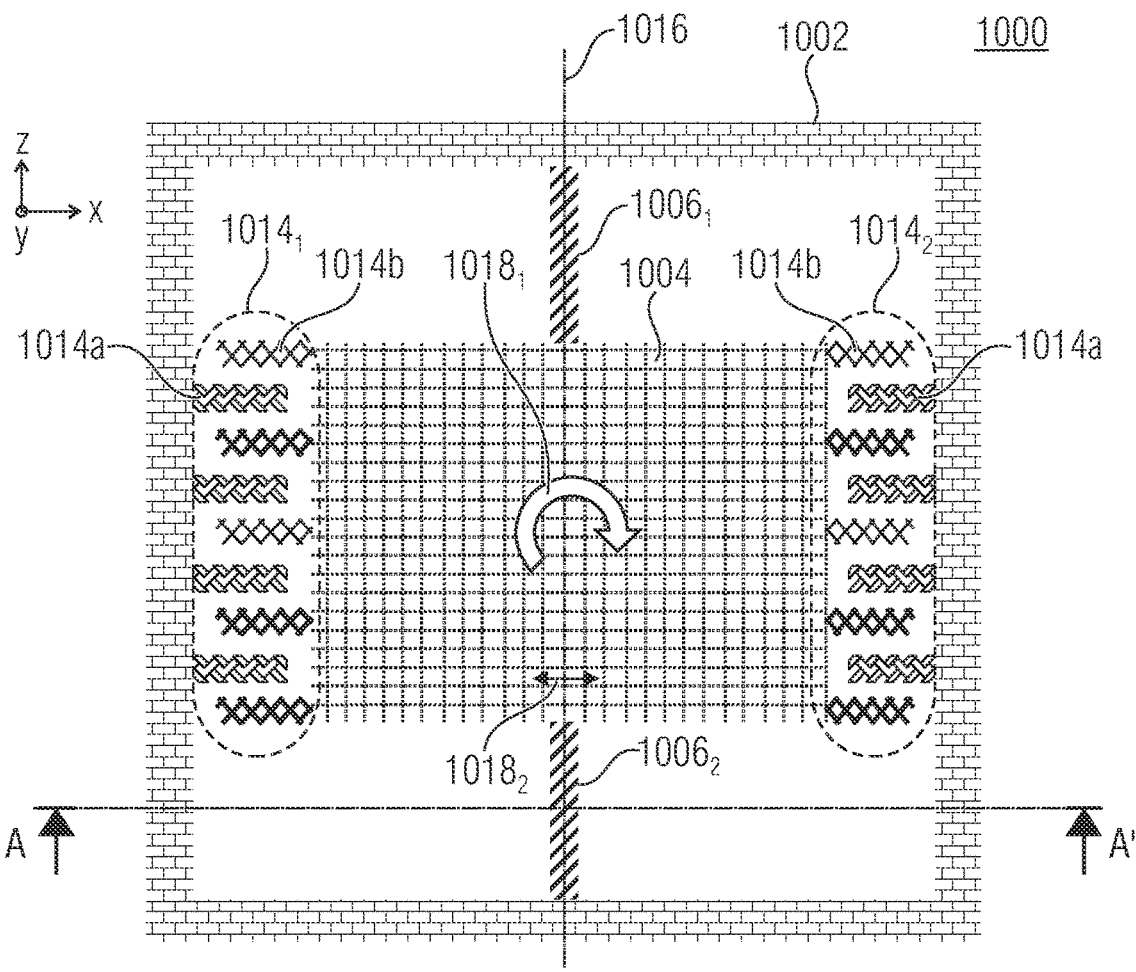
FIG. 8a shows a schematic top view of a known MMS.
Figure 8B:
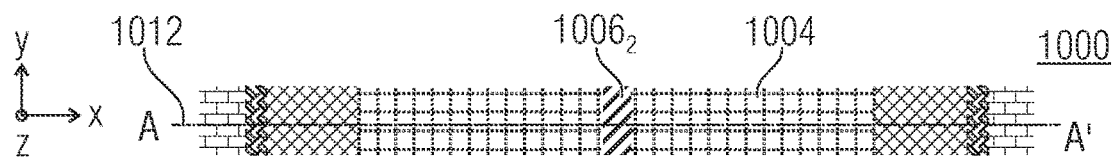
FIG. 8b shows a schematic lateral sectional view of the MMS of FIG. 8a in an undeflected state of the MMS.
Figure 8C:
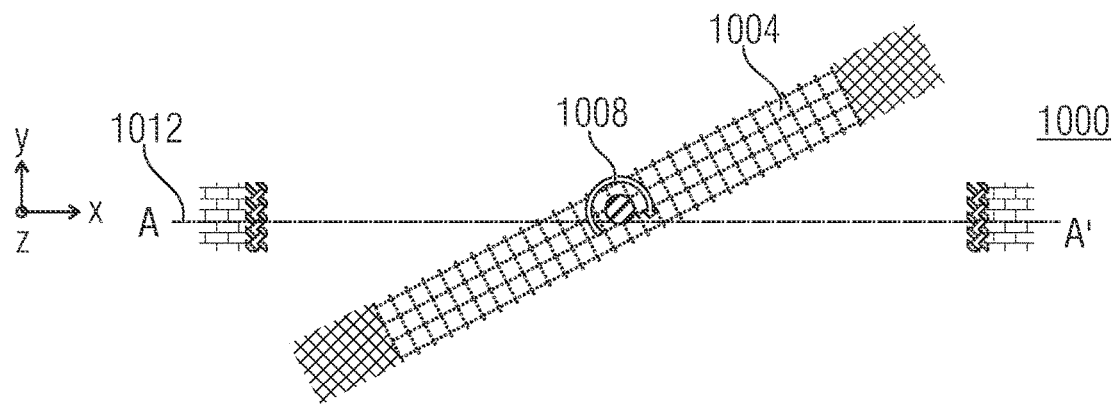
FIG. 8c shows a schematic lateral sectional view of the MMS of FIG. 8a in a deflected state of the MMS.
Figure 10:
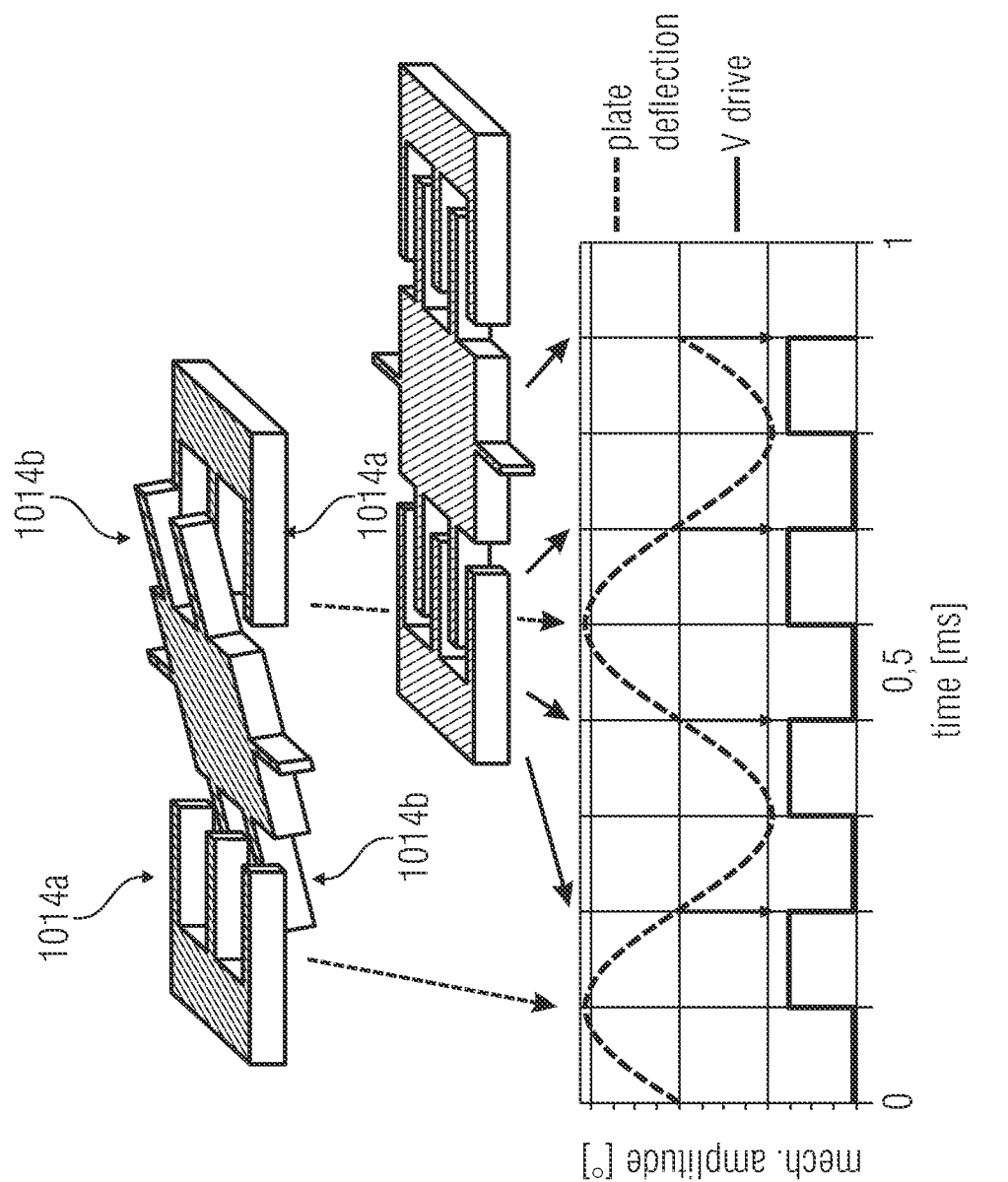
FIG. 10 shows a schematic diagram for resonant operation of micromechanical devices.
Figure 11:
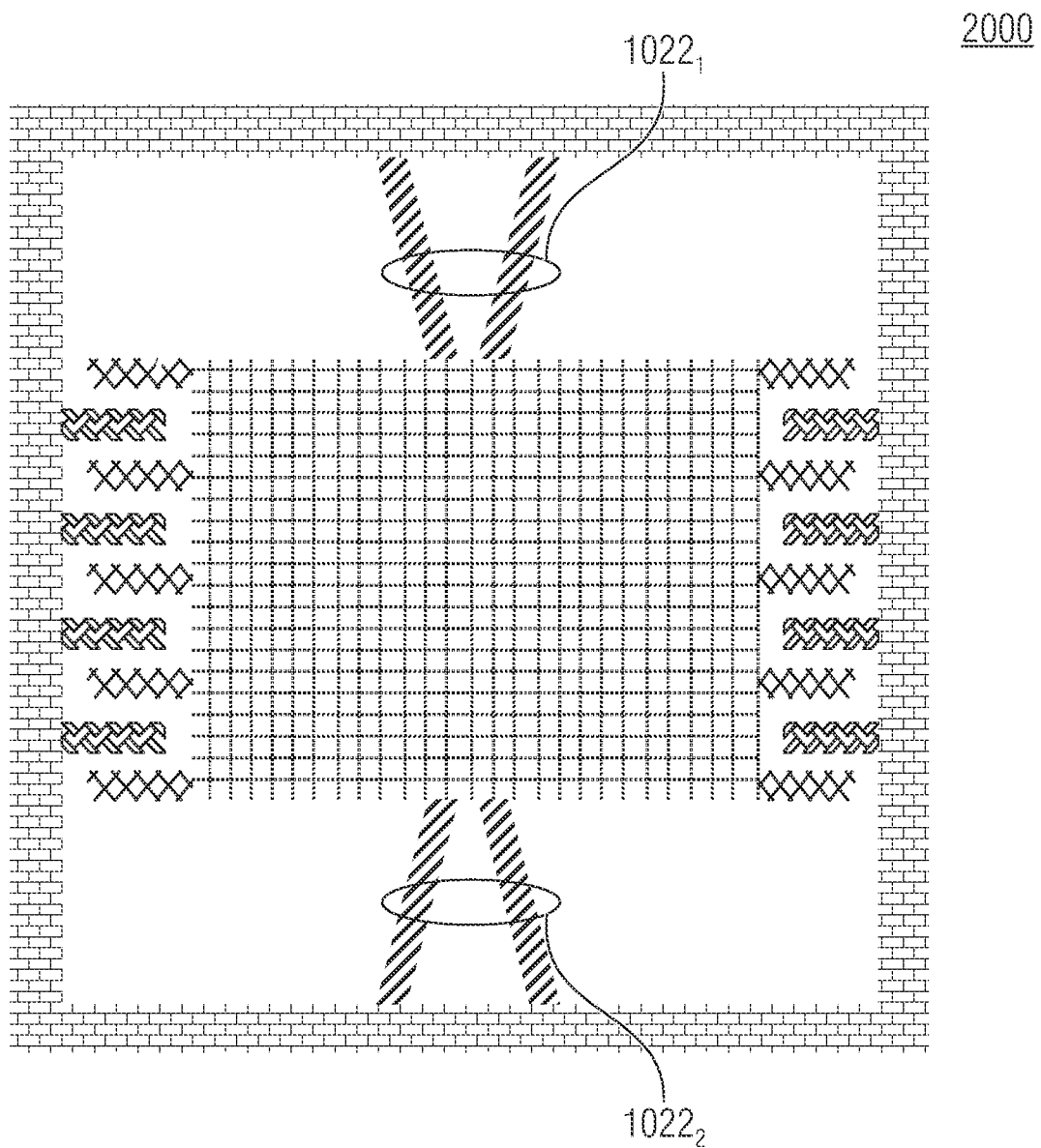
FIG. 11 shows a schematic representation of a known micro-electro-mechanical sys tem.

The shape of the torsion springs or the torsion spring arrangement 16 is implemented, for example, to exhibit an increased lateral (in-plane) bending stiffness compared to a simple beam spring shown, for example, in FIG. 8a, with the same torsional stiffness.

Figure 2:
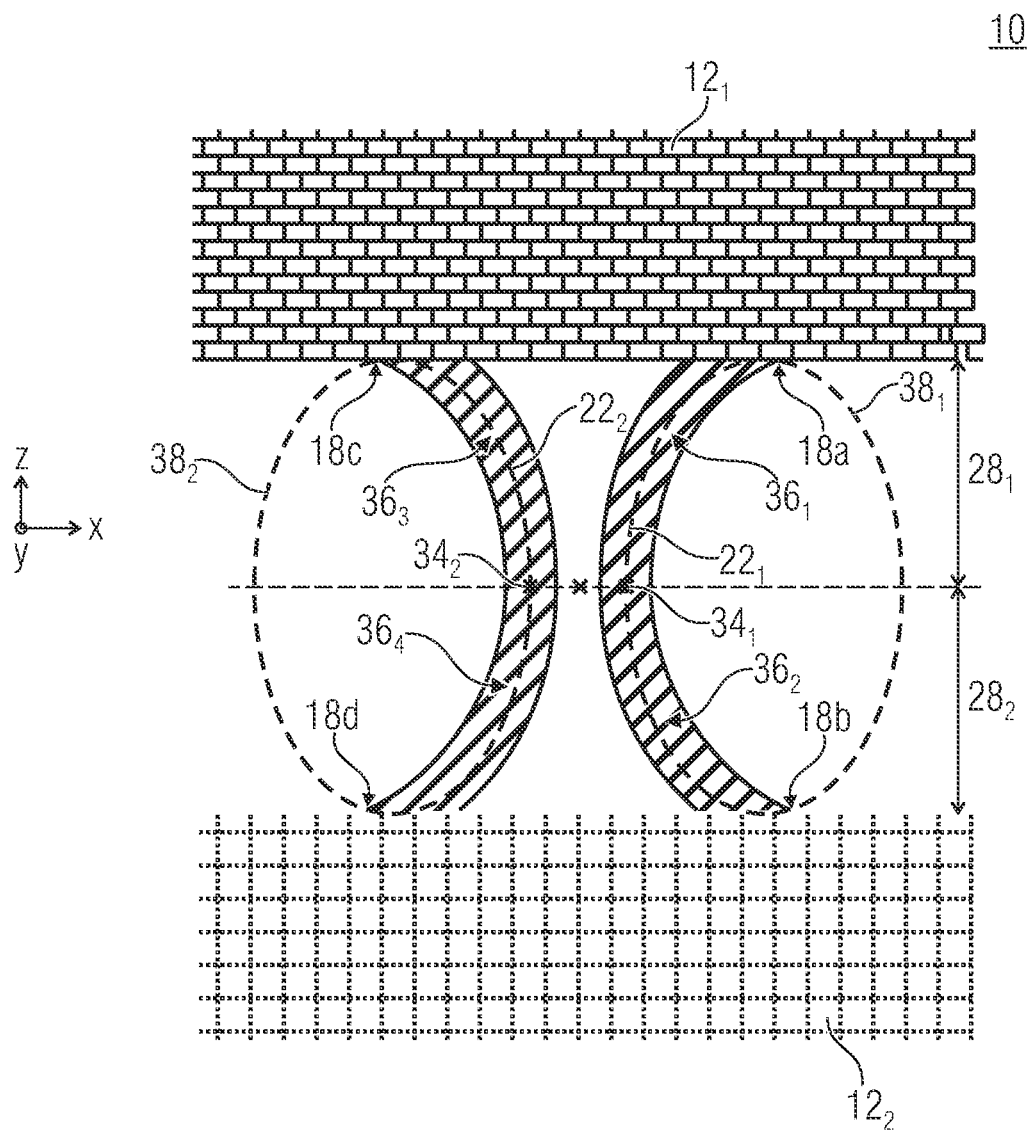
FIG. 2 shows another schematic top view of the MMS of FIG. 1 to explain center lines of the torsion spring elements.

FIG. 2 shows a schematic top view of the MMS 10 comparable to FIG. 1. The center lines $22_1$ and $22_2$ describe, for example, elliptical paths between the contact regions 18a and 18b and 18c and 18d. A previously mentioned regular geometric body is a body that can be represented according to a rule. This applies to the ellipse shown in FIG. 2. Starting from the centers $34_1$ and $34_2$, the center line $22_1$ has a first side $36_1$ extending towards the contact region 18a. A second, opposite side $36_2$ extends towards the contact region 18b. Starting from the center point $34_2$, the center line $22_2$ has a first side $36_3$ extending to the contact region 18c and has a second side $36_4$ extending to the contact region 18d. The sides $36_1$, $36_2$, $36_3$ and $36_4$ may be geometrically similar or advantageously congruent. For example, the sides $36_1$, $36_2$, $36_3$ and $36_4$ may each describe a quarter ellipse path. The center line $22_1$ and/or the center line $22_2$ may thus form a half-ellipse, wherein the end points of the quarter-ellipse paths connected at the centers $34_1$ and $34_2$ may form a major axis of the depicted major ellipse path $38_2$ and $38_2$, or a minor axis thereof. That is opposite or remote ends of the quarter ellipse paths connected at the location of the respective center $34_1$ or $34_2$ may be defined by a major axis or minor axis of the ellipse path $38_1$ and $38_2$, respectively.

According to an embodiment, the major axis and the minor axis here are of the same dimension, that is the major ellipse paths $38_1$ and/or $38_2$ may also have a circular shape.

In other words, known spring shapes, which are intended to increase the resistance of a classical torsion spring to translational and rotational forces in the plane, cannot achieve this while maintaining the torsional stiffness of the spring. This problem is solved according to embodiments. The torsion spring arrangements according to embodiments allow replacing a traditional beam torsion spring according to FIG. 8a by a torsion spring (arrangement) with increased resistance to lateral forces while maintaining or only slightly increasing the torsion spring stiffness. The lateral stiffness of the novel torsion springs can be increased by at least a factor of 2 to 3 compared to a beam spring, for example, although other values are also possible. For this purpose, a micromechanical element $12_1$ and/or $12_2$, such as a micromechanical optical element, can be connected to an abutment, such as the other micromechanical element, via two torsion springs $16_1$ and $16_2$, as shown in FIG. 1 and FIG. 2. The two torsion springs $16_1$ and $16_2$ can be separated from each other over their entire course between the contact regions 18a and 18b and 18c and 18d, and can be arranged point-symmetrically. The center lines of the torsion springs may be described by four quarter-ellipse paths that increase or decrease their distance from the torsion axis 14 in an out ward direction, starting from a center of the spring system. Referring to FIG. 8a, a torsion spring arrangement 16 may be arranged, for example, as a substitution for torsion springs 10061 and/or 10062.

FIG. 3 shows a schematic top view of an MMS 30 in which the torsion spring arrangement 16 is formed such that the torsion spring elements $16_1$ and $16_2$ are formed to be straight in sections and are arranged in a manner similar to an X shape, wherein the torsion spring elements $16_1$ and $16_2$ may be arranged without contact to each other.

This means that, unlike in the MMS 10, the torsion spring elements $16_1$ and $16_2$ can also be formed to be straight at least in sections. According to embodiments, it is also provided for combining curved and straight portions.

Although the center lines $22_1$ and $22_2$ are shown such that the torsion spring elements $16_1$ and $16_2$ each combine exactly two straight portions with each other, another, in particular higher number of straight portions can also be combined with one another, for example at least three, at least four, at least five or at least six. For example, in a central region, a portion may be provided which extends substantially, i.e. within a tolerance range of ±10°, ±5° or ±10, parallel to a surface normal $42_1$ or $42_2$, the surface normal $42_1$ and $42_2$ being related to a surface arranged to be facing a respective other, opposite micromechanical element $12_2$ or $12_1$.

Figure 4:
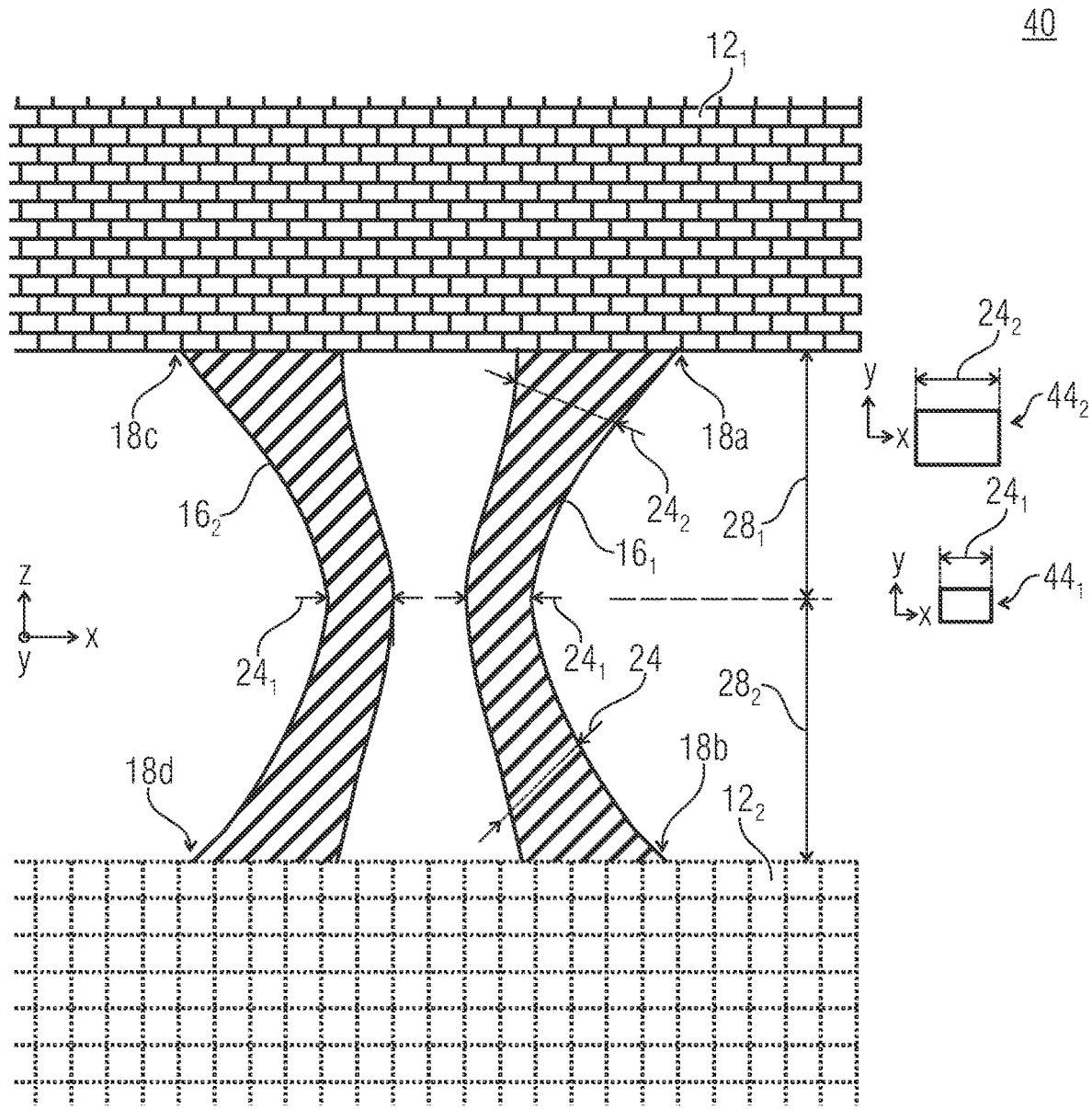
FIG. 4 shows a schematic top view of an MMS according to an embodiment in which the cross-section of the torsion spring elements is variable non-linearly along an axial course of the respective center line.

FIG. 4 shows a schematic top view of an MMS 40 according to an embodiment, wherein a cross-section 44 of the torsion spring elements $16_1$ and/or $16_2$ is variable along an axial course of the respective center line or of the torsion spring element $16_1$ and $16_2$. For this purpose, at least one of the dimensions of the torsion spring elements $16_1$ and/or $16_2$ may be variable in an x/y plane. This can simply be obtained by forming the torsion spring elements $16_1$ and/or $16_2$ with a variable width 24, which increases, for example, starting from a small or minimum width $24_1$ in a central region towards the contact regions 18a and 18b and 18c and 18d. Alternatively or additionally, it is also possible to change a dimension along the y direction. Changing the dimension along a respective direction and/or a combination of both directions allows influencing the torsional stiffness of the respective element in a specific local region. As explained, the axial extension direction is variable in a plane of the micromechanical structure, in the x/z plane. The cross-section 44 of the torsion spring elements 16₁ and 16₂ perpendicular to the axial extension direction can be variable starting from center line centers 34. Here, implementing a linear or non-linear increase may be considered. Alternatively, a linear or non-linear decrease may be implemented. The increase or decrease can be monotonous or even strictly monotonous, but this does not exclude a combination of increase and decrease.

Furthermore, FIG. 4 shows that a non-linear course, i.e., increase and/or decrease, of a distance between the torsion spring elements can be implemented.

Figure 5:
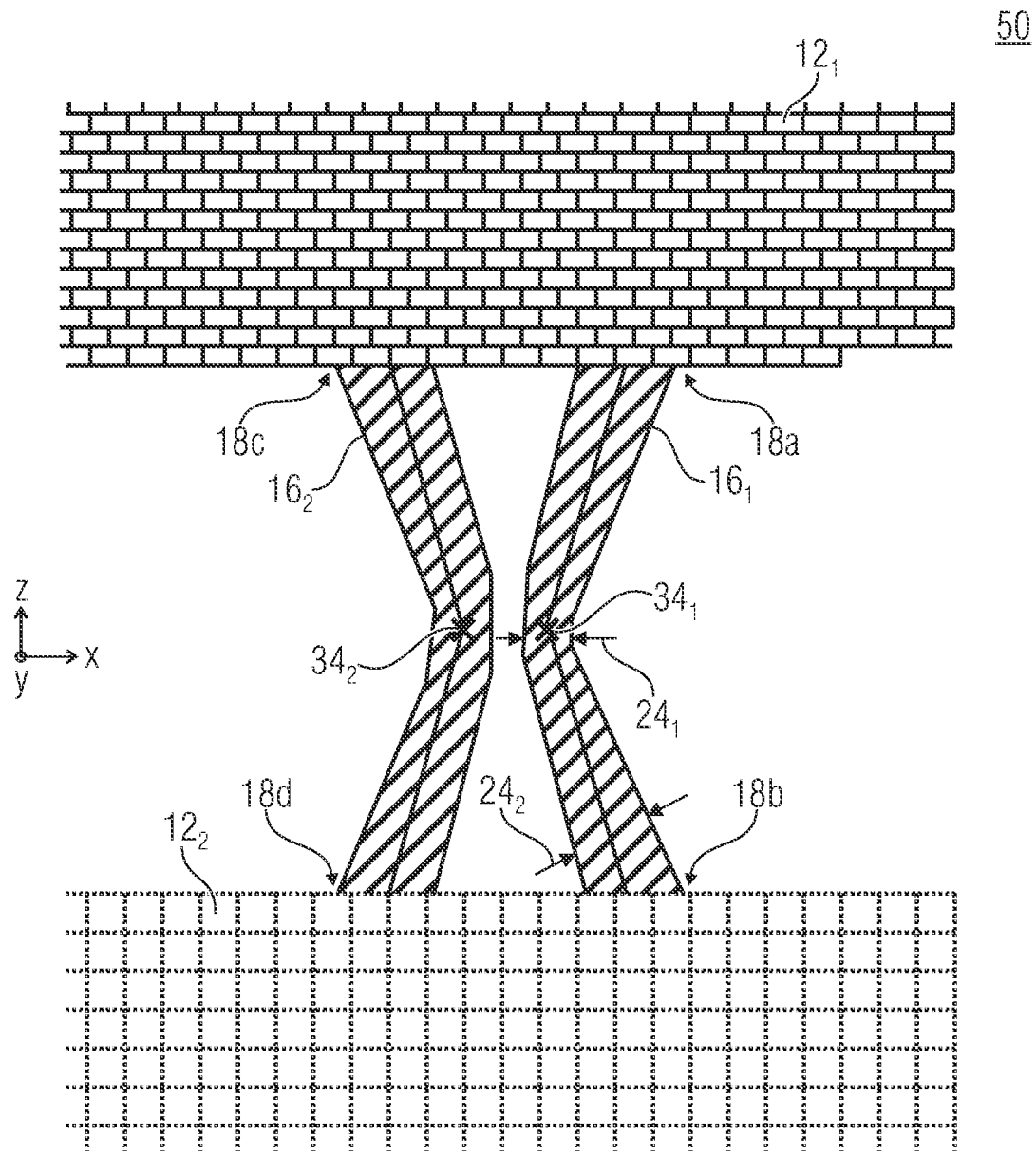
FIG. 5 shows a schematic top view of an MMS according to an embodiment in which the cross section of the torsion spring elements is variable linearly along an axial course of the respective center line.

FIG. 5 shows a schematic top view of an MMS 50 in which a linear increase in cross-section or spring width 24 is implemented as opposed to a non-linear increase towards the contact regions 18a to 18d. Although the nonlinear increase in combination with a curved outer surface of the torsion spring elements obtained by a non-linear change in cross-section of a straight spring section is described in FIG. 4, and a linear increase is described in FIG. 5 with a sectional straight course of the torsion spring elements 16₁ and 16₂, it is possible without any restrictions to provide curved and straight portions with a linear or non-linear increase or decrease.

Furthermore, FIG. 5 shows that a linear course, i.e. increase and/or decrease, of a distance between the torsion spring elements can be implemented.

Figure 6A:
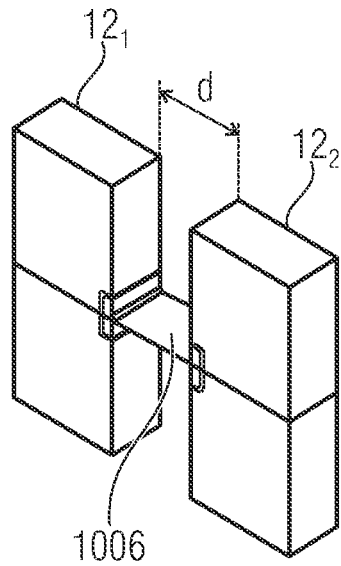
FIGS. 6a-b show schematic perspective views of known MEMS.

FIG. 6a shows a schematic perspective view of a simulation model of a known MMS having a single leaf spring 1006 between micromechanical elements 12₁ and 12₂, thus bridging a distance d therebetween. The distance d can typically be in a range of at least 20 µm and at most 500-1000 µm, about 100 µm.

Figure 6B:
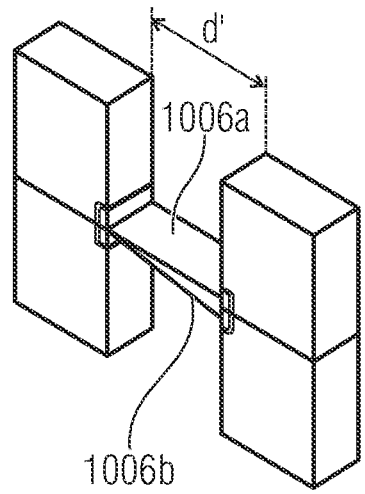

FIG. 6b shows a schematic perspective view of a simulation model of a known MMS having a V-spring arrangement with two leaf springs 1006a and 1006b arranged between the micromechanical elements 12₁ and 12₂ and bridging a distance d' increased compared to the distance d, which is approximately 150% to 200% of d.

Figure 6C:
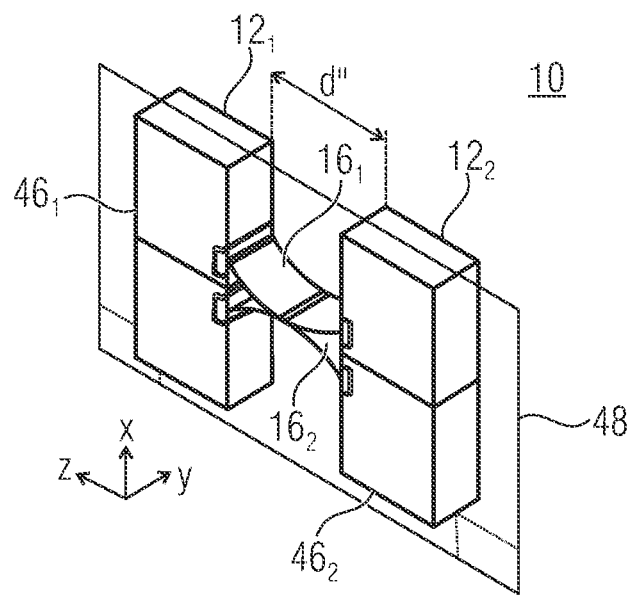
FIGS. 6c-d show schematic perspective views of inventive MEMS in size comparison with the MEMS of FIG. 6a and FIG. 6b.

FIG. 6c shows a schematic perspective view of a simulation model of the MMS 10, illustrating another feature of inventive embodiments. The torsion spring elements 16₁ and 16₂ may be arranged in a common plane of the micromechanical structure, for example in a plane parallel to the x/z plane. This plane may be simultaneously arranged to be parallel to a plane of a main surface 46₁ and/or 46₂ of the micromechanical elements 12₁ and 12₂, respectively, in a rest position of the micromechanical structure, that is in a position in which the micromechanical elements 12₁ and 12₂ are undeflected with respect to each other. A distance d" between the micromechanical elements 12₁ and 12₂ can be increased compared to the distance d, and be, for example, approximately 120% to 150% of d.

Embodiments provide for, in addition to the torsion spring elements 16₁ and 16₂, the micromechanical element 12₁ and/or 12₂ to be also arranged in the common plane in the rest position. For example, a plane 48 may be parallel to the main surfaces 46₁ and 46₂ in the rest position. Both the micromechanical elements 12₁ and 12₂ and the torsion spring elements 16₁ and 16₂ may be arranged in the plane 48.

In other words, FIG. 6c shows a view of an arc-gap torsion spring.

Figure 6D:
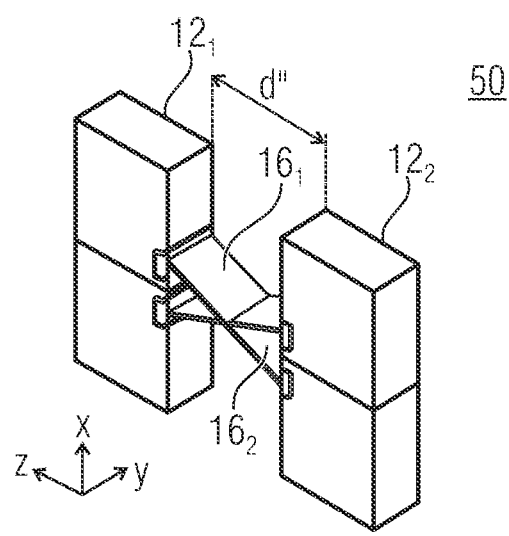

FIG. 6d shows a schematic perspective view of a simulation model of the MMS 30 in which, compared to the MMS 10, the torsion spring elements 16₁ and 16₂ are formed as straight leaf springs, while the MMS 10 has the torsion spring elements 16₁ and 16₂ as continuously curved leaf springs.

In other words, FIG. 6d shows a schematic perspective view of an X-gap torsion spring. FIGS. 6a-d are shown as examples of the same size ratios to emphasize differences, but this does not prevent different MEMS with different dimensions from being encompassed by the present embodiments.

Referring again to FIG. 8a, a described torsion spring arrangement or MMS described herein, such as the MMS 10, 30, 40 or 50, may be arranged at one or more locations, meaning that at least a second, but also a higher number of torsion spring arrangements may be arranged according to the embodiments described herein. Along the torsion axis 1016, another additional torsion spring arrangement may be arranged, for example on respective opposite sides of the micromechanical element 1004. Even though an identical implementation of the torsion spring arrangements arranged along a single torsion axis is of advantage, differently formed torsion spring arrangements can also be arranged, in particular if there are only minor deviations with respect to the torsional stiffness.

FIG. 7a shows a schematic lateral sectional view of an MEMS 70₁ in which the torsion spring arrangement has a higher number of torsion springs 16₁ to 16₄ compared to two, for example four or another, advantageously even number, arranged point-symmetrically about the point of symmetry 32 along a line parallel to the z direction, which in this case may be identical to an axis symmetry about an axis parallel to the y axis for bisecting the torsion spring elements 16₁ to 16₄ in half. The number may have any other value, such as 6, 8 or more.

FIG. 7b shows a schematic lateral sectional view of an MEMS 70₂ in which the torsion spring arrangement also has a higher number of torsion springs 16₁ to 16₄ compared to two, e.g. four or another, advantageously even number, arranged point-symmetrically about the point of symmetry 32. However, in the MEMS 70₂, the torsion spring elements 16₁ to 16₄ are arranged in at least two or more planes along the y direction and form a rectangular pattern with respect to the contact regions 18a-d. With a higher number of torsion spring elements and/or a higher number of planes, any polygon can be obtained easily.

In embodiments of MEMS 70₁ and 70₂, at least four or another higher number of torsion spring elements connect the micromechanical elements 12₁ and 12₂ about a common torsion axis, exemplarily located at or intersecting the location of the point of symmetry 32.

Although some aspects have been described in the context of an apparatus, it is understood that these aspects also represent a description of the corresponding method, so that a block or component of an apparatus is also to be understood to be a corresponding method step or feature of a method step. Similarly, aspects described in connection with or as a method step also represent a description of a corresponding block or detail or feature of a corresponding apparatus.

While this invention has been described in terms of several embodiments, there are alterations, permutations, and equivalents which will be apparent to others skilled in the art and which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the pre sent invention.

The invention claimed is:

1. A micromechanical structure comprising:
   a first micromechanical element;
   a second micromechanical element;
   a torsion spring arrangement comprising a first torsion spring element, comprising a first center line, mechanically connected to the first micromechanical element at a first contact region and to the second micromechanical element at a second contact region, and comprising a second torsion spring element, comprising a second center line, mechanically connected to the first micromechanical element at a third contact region and to the second micromechanical element at a fourth contact region in order to connect the first micromechanical element and the second micromechanical element to be movable relative to each other;
   wherein a distance between the first center line and the second center line, starting from the first and third contact regions towards the second and fourth contact regions, decreases in a first portion and increases in a second portion;
   wherein, in a rest position of the micromechanical structure, the first torsion spring element and the second torsion spring element are arranged without contact to each other;
   wherein the first center line comprises a first center and the second center line comprises a second center;
   wherein the first center line, on a first side starting from the first center, extends in a quarter ellipse path towards the first contact region and, on a second side opposite the first side, in a quarter ellipse path towards the second contact region; and
   wherein the second center line, on a first side starting from the second center, ex tends in a quarter ellipse path towards the third contact region and, on a second side opposite the first side, in a quarter ellipse path towards the fourth contact region;
   wherein the center lines of the torsion spring elements extend along axial extension directions of the torsion spring elements, wherein the extension directions are variable in a plane of the micromechanical structure, wherein a cross-section of the first torsion spring element and of the second torsion spring element increases linearly or non-linearly perpendicularly to the axial extension direction and starting from the center line centers of the center line; or decreases linearly or non-linearly.

2. The micromechanical structure in accordance with claim 1, wherein the cross-section of the first torsion spring element and of the second torsion spring element increases linearly or non-linearly perpendicularly to the axial extension direction and starting from the center line centers of the center line.

3. The micromechanical structure in accordance with claim 1, wherein the cross-section of the first torsion spring element and of the second torsion spring element increases linearly or non-linearly in a strictly monotonous manner perpendicularly to the axial extension direction and starting from the center line centers of the center line.

4. The micromechanical structure in accordance with claim 1, wherein the cross-section of the first torsion spring element and of the second torsion spring element de creases linearly or non-linearly perpendicularly to the axial extension direction and starting from the center line centers of the center line.

5. The micromechanical structure in accordance with claim 1, wherein the cross-section of the first torsion spring element and of the second torsion spring element de creases linearly or non-linearly in a strictly monotonous manner perpendicularly to the axial extension direction and starting from the center line centers of the center line.

6. The micromechanical structure in accordance with claim 1, wherein the first torsion spring element and the second torsion spring element are formed to be point-symmetrical around a common point of symmetry.

7. The micromechanical structure in accordance with claim 1, wherein opposite ends of two quarter ellipse paths connected in the first and second centers form a main axis of an overall ellipse path or a minor axis of the overall ellipse path.

8. The micromechanical structure in accordance with claim 1, wherein the quarter ellipse paths are quarter circles.

9. The micromechanical structure in accordance with claim 1, wherein the distance between the center lines comprises a minimum in a region of center line centers and increases starting from the center line centers towards the first micromechanical element and towards the second micromechanical element.

10. The micromechanical structure in accordance with claim 1, wherein the first torsion spring element and the second torsion spring element are arranged in a common plane of the micromechanical structure, wherein, in the rest position of the micromechanical structure, the plane is arranged to be parallel to a plane of a main surface of the first and/or second micromechanical elements.

11. The micromechanical structure in accordance with claim 10, wherein the first torsion spring element and the second torsion spring element and at least one of the first micromechanical element and the second micromechanical element are arranged in a common plane in the rest position.

12. The micromechanical structure in accordance with claim 1, wherein the torsion spring arrangement is a first torsion spring arrangement, and which comprises a second torsion spring arrangement disposed along a torsion axis of the first torsion spring arrangement at a side of the first micromechanical element opposite the first torsion spring arrangement.

13. The micromechanical structure in accordance with claim 1, wherein the first micromechanical element and/or the second micromechanical element comprise an optical element.

14. The micromechanical structure in accordance with claim 1, wherein the torsion spring arrangement comprises at least four torsion springs comprising the first torsion spring element and the second torsion spring element which connect the first micromechanical element and the second micromechanical element around a common torsion axis.

15. A micromechanical structure comprising:
   a first micromechanical element;
   a second micromechanical element;
   a torsion spring arrangement comprising a first torsion spring element, comprising a first center line, mechanically connected to the first micromechanical element at a first contact region and to the second micromechanical element at a second contact region, and comprising a second torsion spring element, comprising a second center line, mechanically connected to the first micromechanical element at a third contact region and to the second micromechanical element at a fourth contact region in or der to connect the first micromechanical element and the second micromechanical element to be movable relative to each other;

wherein a distance between the first center line and the second center line, starting from the first and third contact regions towards the second and fourth contact regions, decreases in a first portion and increases in a second portion;

wherein, in a rest position of the micromechanical structure, the first torsion spring element and the second torsion spring element are arranged without contact to each other;

wherein the distance between the center lines comprises a minimum in a region of center line centers and increases starting from the center line centers towards the first micromechanical element and towards the second micromechanical element; and the torsion spring elements are formed to be straight in sections and are arranged in accordance with an X shape, wherein the torsion spring elements are arranged without contact to each other.

16. The micromechanical structure in accordance with claim 15, wherein the center lines of the torsion spring elements extend along axial extension directions of the torsion spring elements, wherein the extension directions are variable in a plane of the micromechanical structure, wherein a cross-section of the first torsion spring element and of the second torsion spring element increases linearly or non-linearly perpendicularly to the axial extension direction and starting from the center line centers of the center line; or decreases linearly or non-linearly.

17. The micromechanical structure in accordance with claim 16, wherein the cross-section of the first torsion spring element and of the second torsion spring element in creases linearly or non-linearly perpendicularly to the axial extension direction and starting from the center line centers of the center line.

18. The micromechanical structure in accordance with claim 16, wherein the cross-section of the first torsion spring element and of the second torsion spring element in creases linearly or non-linearly in a strictly monotonous manner perpendicularly to the axial extension direction and starting from the center line centers of the center line.

19. The micromechanical structure in accordance with claim 16, wherein the cross-section of the first torsion spring element and of the second torsion spring element de creases linearly or non-linearly perpendicularly to the axial extension direction and starting from the center line centers of the center line.

20. The micromechanical structure in accordance with claim 16, wherein the cross-section of the first torsion spring element and of the second torsion spring element de creases linearly or non-linearly in a strictly monotonous manner perpendicularly to the axial extension direction and starting from the center line centers of the center line.

21. A method of providing a micromechanical structure, comprising:

providing a first micromechanical element;
providing a second micromechanical element;
arranging a torsion spring arrangement comprising a first torsion spring element, comprising a first center line, so that it is mechanically connected to the first micromechanical element at a first contact region and to the second micromechanical element at a second contact region, and comprising a second torsion spring element, comprising a second center line, so that it is mechanically connected to the first micromechanical element at a third contact region and to the second micromechanical element at a fourth contact region in order to connect the first micromechanical element and the second micromechanical element to be movable relative to each other;

such that a distance between the first center line and the second center line, starting from the first and third contact regions towards the second and fourth contact regions, decreases in a first portion and increases in a second portion; and such that, in a rest position of the micromechanical structure, the first torsion spring element and the second torsion spring element are arranged without contact to each other;

such that the first center line comprises a first center and the second center line comprises a second center;

such that the first center line, on a first side starting from the first center, extends in a quarter ellipse path towards the first contact region and, on a second side opposite the first side, in a quarter ellipse path towards the second contact region; and such that the second center line, on a first side starting from the second center, extends in a quarter ellipse path towards the third contact region and, on a second side opposite the first side, in a quarter ellipse path towards the fourth contact region;

such that the center lines of the torsion spring elements extend along axial extension directions of the torsion spring elements, such that the extension directions are variable in a plane of the micromechanical structure, such that a cross-section of the first torsion spring element and of the second torsion spring element increases linearly or non-linearly perpendicularly to the axial extension direction and starting from the center line centers of the center line; or decreases linearly or non-linearly.

22. A method of providing a micromechanical structure, comprising:

providing a first micromechanical element;
providing a second micromechanical element;
arranging a torsion spring arrangement comprising a first torsion spring element, comprising a first center line, so that it is mechanically connected to the first micromechanical element at a first contact region and to the second micromechanical element at a second contact region, and comprising a second torsion spring element, comprising a second center line, so that it is mechanically connected to the first micromechanical element at a third contact region and to the second micromechanical element at a fourth contact region in order to connect the first micromechanical element and the second micromechanical element to be movable relative to each other;

such that a distance between the first center line and the second center line, starting from the first and third contact regions towards the second and fourth contact regions, decreases in a first portion and increases in a second portion; and such that, in a rest position of the micromechanical structure, the first torsion spring element and the second torsion spring element are arranged without contact to each other;

such that the distance between the center lines comprises a minimum in a region of center line centers and increases starting from the center line centers towards the first micromechanical element and towards the second micromechanical element; and the torsion spring elements are formed to be straight in sections and are arranged in accordance with an X shape such that the torsion spring elements are arranged without contact to each other.

* * * * *